United States Patent
Avanzino et al.

(10) Patent No.: US 6,506,677 B1
(45) Date of Patent: Jan. 14, 2003

(54) METHOD OF FORMING CAPPED COPPER INTERCONNECTS WITH REDUCED HILLOCK FORMATION AND IMPROVED ELECTROMIGRATION RESISTANCE

(75) Inventors: Steven C. Avanzino, Cupertino, CA (US); Minh Van Ngo, Fremont, CA (US); Amit P. Marathe, Milpitas, CA (US); Hartmut Ruelke, Wilschdorf (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,186

(22) Filed: May 2, 2001

(51) Int. Cl.[7] .................................. H01L 21/44
(52) U.S. Cl. .............. 438/687; 438/622; 438/638; 438/675; 438/677; 438/792
(58) Field of Search ................ 438/687, 622, 438/623, 624, 625, 628, 631, 634, 638, 660, 675, 676, 677, 722, 791, 792, 793, 627

(56) References Cited

U.S. PATENT DOCUMENTS 6,355,571 B1 * 3/2002 Huang et al. ............... 438/573

2001/0003064 A1 * 6/2001 Ohto ........................ 438/687

OTHER PUBLICATIONS

Co-pending application Ser. No. 09/497,850, filed Feb. 4, 2000.

Client reference No. G0076 (Docket No. 50432–169), filed May 2, 2001.

* cited by examiner

Primary Examiner—Tuan H. Nguyen

(57) ABSTRACT

The electromigration resistance of capped Cu or Cu alloy interconnects is significantly improved by sequentially and contiguously treating the exposed planarized surface of in-laid Cu with a plasma containing $NH_3$ and $N_2$, ramping up the introduction of $SiH_4$ and then initiating deposition of a silicon nitride capping layer. Embodiments include treating the exposed surface of in-laid Cu with a soft $NH_3$ plasma diluted with $N_2$, ramping up the introduction of $SiH_4$ in two stages, and then initiating plasma enhanced chemical vapor deposition of a silicon nitride capping layer, while maintaining substantially the same pressure, $N_2$ flow rate and $NH_3$ flow rate during plasma treatment, $SiH_4$ ramp up and silicon nitride deposition. Embodiments also include Cu dual damascene structures formed in dielectric material having a dielectric constant (k) less than about 3.9.

18 Claims, 3 Drawing Sheets

METHOD OF FORMING CAPPED COPPER INTERCONNECTS WITH REDUCED HILLOCK FORMATION AND IMPROVED ELECTROMIGRATION RESISTANCE

TECHNICAL FIELD

The present invention relates to copper (Cu) and/or Cu alloy metallization in semiconductor devices, particularly to a method for forming reliably capped Cu or Cu alloy interconnects, such as single and dual damascene structures formed in low dielectric constant materials. The present invention is particularly applicable to manufacturing high speed integrated circuits having submicron design features, and high conductivity interconnects with improved electromigration resistance.

BACKGROUND ART

The escalating requirements for high density and performance associated with ultra large scale integration semiconductor wiring require responsive changes in interconnection technology. Such escalating requirements have been found difficult to satisfy in terms of providing a low R×C (resistance×capacitance) interconnect pattern with electromigration resistance, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member.

In application Ser. No. 09/497,850 filed on Feb. 4, 2000, a method is disclosed comprising treating the surface of a Cu or Cu alloy layer with a plasma containing nitrogen and ammonia, followed by depositing the capping layer in the presence of nitrogen in the same reaction chamber for improved adhesion of the capping layer to the copper interconnect. This technique has been effective in improving adhesion of the capping layer. However, after further experimentation and investigation, it was found that capped Cu or Cu alloy interconnects, as in damascene and dual damascene structures, exhibited poor electromigration resistance, particular in those cases wherein the exposed surface of the Cu or Cu alloy was treated with a plasma to remove a copper oxide surface film prior to deposition of the capping layer, e.g., silicon nitride. Such poor electromigration resistance adversely impacts device reliability and results in poor product yield. In application Ser. No. 09/846,611 filed on May 2, 2001, a method of plasma treating an upper surface of inlaid Cu or Cu alloy metallization is disclosed using a relatively soft $NH_3$ plasma treatment heavily diluted with $N_2$ with an attendant significant improvement in electromigration resistance and wafer-to-wafer uniformity.

As design rules extend deeper into the submicron range, such as about 0.12 micron and under, the reliability of interconnect patterns becomes particularly critical. Therefore, the adhesion of capping layers to Cu interconnects and the accuracy of interconnects for vertical metallization levels require even greater reliability. In addition, as the design rules plunge deeper into the sub-micron regime, electromigration becomes increasingly problematic. Accordingly, there exists a continuing need for methodology enabling the formation of encapsulated Cu and Cu alloy interconnects for vertical metallization levels with greater accuracy, reliability and electromigration resistance. There exists a particular continuing need for methodology enabling the formation of capped Cu or Cu alloy interconnect, particularly in damascene structures, e.g., dual damascene structures formed in dielectric material having a low dielectric constant (k), with improved reliability and electromigration resistance.

DISCLOSURE OF THE INVENTION

An advantage of the present invention is a method of manufacturing a semiconductor device having highly reliable capped Cu or Cu alloy interconnect.

Another advantage of the present invention is a method of manufacturing a semiconductor device comprising a silicon nitride capped Cu or Cu alloy interconnect member with improved electromigration resistance.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising the sequential steps: (a) introducing a wafer containing inlaid copper (Cu) or a Cu alloy into a chamber; (b) treating an exposed surface of the Cu or Cu alloy with a plasma containing ammonia ($NH_3$) and in the chamber at a pressure; (c) introducing silane ($SiH_4$) into the chamber; and (d) depositing a silicon nitride capping layer on the surface of the Cu or Cu alloy layer in the chamber, the method comprising conducting steps (c) and (d) while substantially maintaining the pressure used in step (b).

Embodiments of the present invention include plasma treating the exposed surface of inlaid Cu with a soft plasma comprising $NH_3$ heavily diluted with $N_2$, and maintaining the pressure, $N_2$ flow rate and $NH_3$ flow rate throughout steps (c) and (d). Embodiments of the present invention further include conducting step (c) into stages. During the first stage ($c_1$), $SiH_4$ is introduced until a flow rate of about 70 to about 90 sccm is achieved, typically in about 2 to about 5 seconds, followed by stage ($c_2$) during which the $SiH_4$ flow rate is increased to about 130 to about 170 sccm typically over a period of about 3 seconds to about 8 seconds. Subsequently, a suitable RF power is applied, as about 400 to about 600 watts, to implement PECVD of the silicon nitride capping layer, as at a thickness of about 450 Å to about 550 Å.

Embodiments of the present invention further include single and dual damascene techniques comprising forming an opening in an interlayer dielectric on a wafer, depositing an underlying diffusion barrier layer, such as Ta and/or TaN, lining the opening and on the interdielectric layer, depositing a seedlayer, depositing the Cu or a Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the deposition chamber for processing in accordance with embodiments of the present invention by treating the exposed surface of the Cu or Cu alloy layer with a soft plasma employing a relatively low $NH_3$ flow rate and a relatively high $N_2$ flow rate, ramping up the introduction of $SiH_4$ and then depositing a silicon nitride capping layer on the treated surface.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
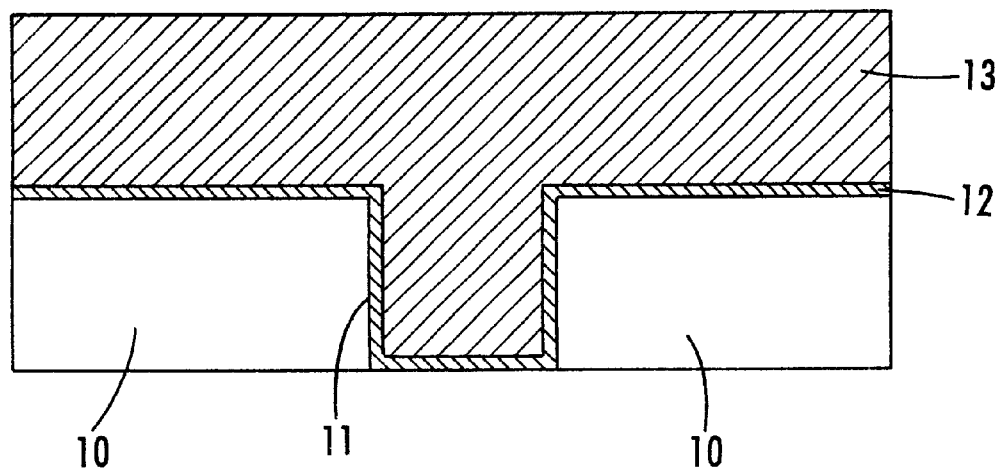
FIGS. 1–4 schematically illustrate sequential phases of a method in accordance with an embodiment of the present invention.

The present invention addresses and solves problems attendant upon forming capped Cu or Cu alloy interconnects, as with a capping layer of silicon nitride. Methodology in accordance with embodiments of the present invention enables a significant improvement in the adhesion of a capping layer such as silicon nitride, to a Cu or Cu alloy interconnect member, thereby preventing capping layer peeling and preventing copper diffusion. In addition, embodiments of the present invention significantly reduce hillock formation, and significantly improve electromigration resistance, and significantly improve wafer-to-wafer uniformity. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, the electromigration resistance of encapsulated Cu interconnect members becomes increasingly significant. It was found that conventional practices in forming a Cu interconnect member in a damascene opening, e.g., a dual damascene opening, result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu and/or Cu alloy interconnect member. Consequently, cracks are generated at the Cu or Cu alloy/copper oxide interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion. The soft plasma treatment disclosed in application Ser. No. 09/846,711 filed on May 2, 2001, employing a relatively low $NH_3$ flow rate and a relatively high $N_2$ flow rate, results in a significant improvement in electromigration resistance. The present invention constitutes a further refinement by significantly reducing hillock formation on the exposed, plasma-treated surface of the in-laid Cu and, hence, further significantly reduces electromigration failures.

Upon conducting further experimentation and investigation, it was found that the serial plasma-$NH_3$ treatment and with subsequent silicon nitride capping layer deposition resulted in hillock formation on the exposed surface of the in-laid Cu. Continuing experimentation and investigation led to the belief that the problem of hillock formation stemmed from the extended period of time in which the unconstrained Cu interconnect was held at elevated temperatures during the sequential plasma treatment and silicon nitride capping layer deposition.

The present invention addresses and solves that problem by providing a process flow comprising sequential contiguous plasma treatment and deposition steps while minimizing the plasma treatment time and power but ensuring complete copper oxide reduction. In accordance with embodiments of the present invention, the $N_2$ and $NH_3$ flow rate, as well as the pressure, is maintained at an essentially steady state throughout the process flow, including plasma treatment and silicon nitride capping layer deposition. Embodiments of the present invention comprise treating the surface of the in-laid Cu with a soft $NH_3$ plasma employing a relatively low $NH_3$ flow rate and a relatively high $N_2$ flow rate, which $NH_3$ and $N_2$ flow rates are substantially maintained throughout plasma treatment and silicon nitride deposition.

In accordance with embodiments of the present invention, a wafer containing in-laid Cu having an exposed surface with a copper oxide film believed to be generated by CMP is introduced into a deposition chamber. A $N_2$ flow rate of about 8,000 to about 9,200 sccm, e.g., 8,600 sccm, and an $NH_3$ flow rate of about 210 to about 310 sccm, e.g., about 260 sccm, is established. A pressure of about 3 to about 5 Torr and temperature of about 300° C. to about 400° C. are also established. A plasma is then initiated, as after about 10 to about 15 seconds, typically about 15 seconds, by applying an RF power of about 50 watts to about 200 watts, and the exposed surface of the in-laid Cu is treated with a soft $NH_3$ plasma to reduce the copper oxide film, typically for about 5 to about 40 seconds, e.g., about 5 to about 25 seconds.

The present invention addresses and solves the problem of surface contamination and surface reaction of inlaid Cu metallization after plasma treatment, as with an $NH_3$-containing plasma, thereby significantly improving the integrity of the interface between the Cu interconnect and capping layer, e.g., silicon nitride capping layer. Moreover, the present invention significantly reduces the formation of hillocks thereby further reducing electromigration failures, and significantly improves wafer-to-wafer uniformity. Accordingly, the present invention enables a significant increase in device reliability, particularly in the submicron regime.

In accordance with embodiments of the present invention, $SiH_4$ is slowly introduced into the chamber, after soft plasma treatment of the Cu surface to remove copper oxide, while substantially maintaining the pressure, $N_2$ flow rate and $NH_3$ flow rate. The $SiH_4$ flow rate is ramped up to a suitable deposition flow rate, as in a plurality of stages. For example, $SiH_4$ can be introduced during a first stage until a flow rate of about 70 to about 90 sccm is achieved, typically over a period of about 2 to about 5 seconds, and subsequently ramped up to a suitable deposition flow rate of about 130 to about 170 sccm, typically over a period of about 3 to about 8 seconds. Deposition of the silicon nitride capping layer is then initiated by striking a plasma.

The mechanism underpinning the significant reduction in hillock formation and, hence, electromigration performance, attendant upon implementing the inventive methodology disclosed herein is not known with certainty. However, it is believed that maintaining substantially the same $NH_3$ and $N_2$ flow rates and pressure throughout the process flow, i.e., throughout plasma treatment and silicon nitride capping layer deposition, enables utilizing steady state conditions while minimizing the time and power at which the unconstrained Cu interconnect is exposed to elevated temperatures. In addition, the soft plasma treatment employing a high $N_2$ flow rate and low $NH_3$ flow rate avoids sensitizing the clean Cu surface, thereby reducing its reactivity. Moreover, the slow introduction of $SiH_4$ avoids a sudden assault of the Cu surface with a violent surge of reactant species, thereby further preventing reactions which adversely impact electromigration.

Figure 5:
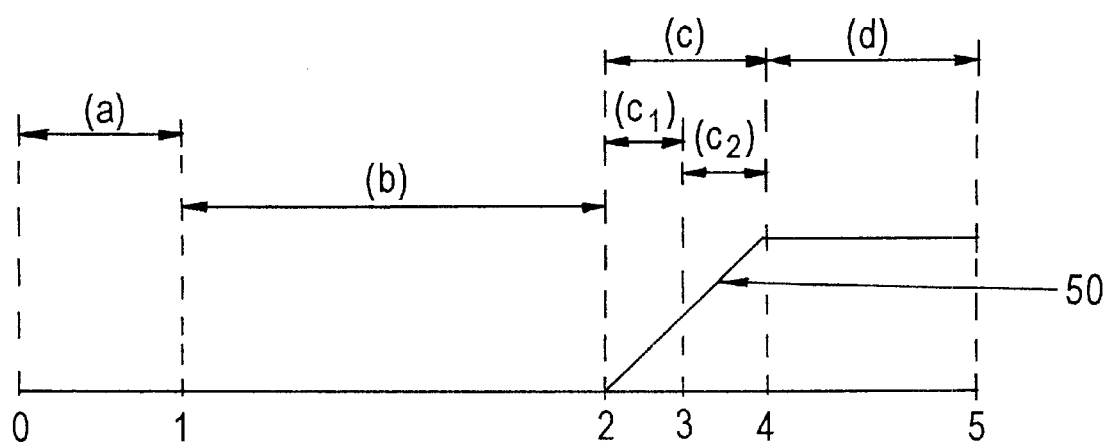
FIG. 5 illustrates a process flow in accordance with an embodiment of the present invention.

A process flow of an embodiment in accordance with the present invention is schematically illustrated in FIG. 5 wherein point 0 represents the time at which the wafer containing inlaid Cu metallization is introduced into a chamber or initiation of step (a), which proceeds until point 1. During step (a), $N_2$ is introduced to a flow rate of about 8,000 to about 9,200 sccm, e.g., 8,600 sccm, and $NH_3$ is introduced to a flow rate of about 210 to about 310 sccm, e.g., about 260 sccm. The deposition chamber, is started and maintained at about 400°, while the pressure is elevated to a suitable treatment pressure.

During step (b) between points 1 and 2, the wafer temperature reached about 300° to about 400° C., the pressure elevated to about 3 to about 5 Torr and a plasma initiated, as at an RF power of about 50 to about 200 watts. During step (b), the exposed Cu surface containing an oxide film is treated with a soft plasma containing $NH_3$ for about 5 to about 40 seconds, e.g., about 25 seconds, resulting in a clean sensitized Cu surface.

After soft plasma treatment, and while maintaining the $NH_3$ and $N_2$ flow rates, and while maintaining the pressure, step (c) is implemented, typically in two stages ($c_1$) and ($c_2$) by ramping up the flow of $SiH_4$ as illustrated by line 50. During stage ($c_1$), $SiH_4$ is ramped up to an intermediate flow rate of about 70 to about 90 sccm, e.g., about 80 sccm, typically over a period of about 2 to about 5 seconds, e.g., about 3 seconds, while pressure and temperature are maintained. During stage ($c_2$), the $SiH_4$ flow rate is increased to about 130 to about 170 sccm, e.g., about 150 sccm, typically over a period of about 3 to about 8 seconds, e.g., about 5 seconds. At this point, step (d) is implemented by applying an RF power of about 400 to about 600 watts, e.g., about 520 watts, to generate a plasma and deposit a silicon nitride capping layer, typically over a period of about 8 seconds to about 15 seconds, e.g., about 12 seconds, as at a thickness of about 450 Å to about 550 Å. The resulting silicon nitride capped Cu interconnect exhibits significantly enhanced electromigration resistance vis-à-vis those produced by prior practices.

Improved electromigration resistance of capped Cu interconnects formed in accordance with embodiments of the present invention was confirmed by lognormal sigma measurements. Lognormal sigma is a measure of spread in electromigration (EM) data (failure times). Higher sigma leads to a lower projected EM lifetime at use conditions. The product EM lifetime is calculated by the following eqn: Lifetime=T50% exp(−N sigma) where T50% is Median time to fail (MTTF) and N=6 for T0.1% failure rate and product factor of about $10^6$. Therefore, higher values of sigma could cause a significant degradation in projected lifetime due to the exponential dependence. The inventive process flow disclosed herein not only improves T50% but also give a tight sigma, which leads to higher projected DM lifetime.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as Ta and/or TaN, and filling the opening with Cu. Advantageously, the opening in the interlayer dielectric can be filled by initially depositing a seed layer and then electroplating or electrolessly plating the Cu. Typical seedlayers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed in accordance with an embodiment of the present invention, thereby substantially eliminating or significantly reducing surface contamination and surface reaction and, hence, significantly reducing electromigration failures.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

An embodiment of the present invention is schematically illustrated in FIGS. 1–4, wherein similar reference numerals denote similar elements or features. Adverting to FIG. 1, damascene opening 11, such as a contact or via hole, is formed in dielectric layer 10, e.g., a low-k material. It should be understood that opening 11 can also be formed as a dual damascene opening comprising a contact or via hole section in communication with a trench section. A barrier layer 12 is deposited, such as Ta and/or TaN, and Cu layer 13 is then deposited. Upon electroplating or electroless plating layer 13, a seed layer (not shown) is deposited on barrier layer 12.

Figure 2:
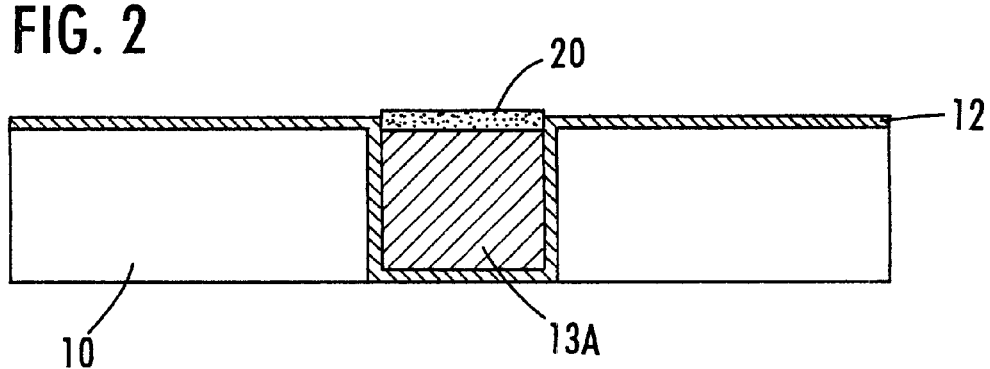

Adverting to FIG. 2, the portions of the Cu alloy layer 13 extending beyond opening 11 are removed, as by CMP. As a result, a thin film of copper oxide 20 is formed on the exposed surface of the Cu interconnect member 13A. The wafer containing the Cu metallization is then introduced into deposition chamber and processed in accordance with embodiments of the present invention.

Figure 3:
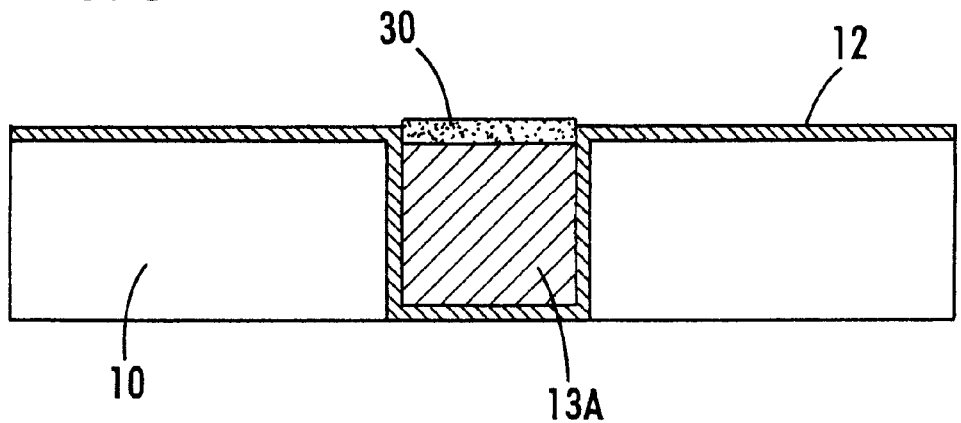

Adverting to FIG. 3, in accordance with embodiments of the present invention, the exposed surface of the Cu interconnect member 13A having a thin copper oxide film 20 thereon is treated with a soft plasma at a relatively low $NH_3$ flow rate and a relatively high $N_2$ flow rate to remove or substantially reduce the thin copper oxide film 20 leaving a clean, sensitized and highly reactive Cu surface 30. At this point, while maintaining the pressure and $NH_3$ and $N_2$ flow rates, step (c) is initiated by ramping up the flow rate of $SiH_4$ in stages ($c_1$) and ($c_2$).

Figure 4:
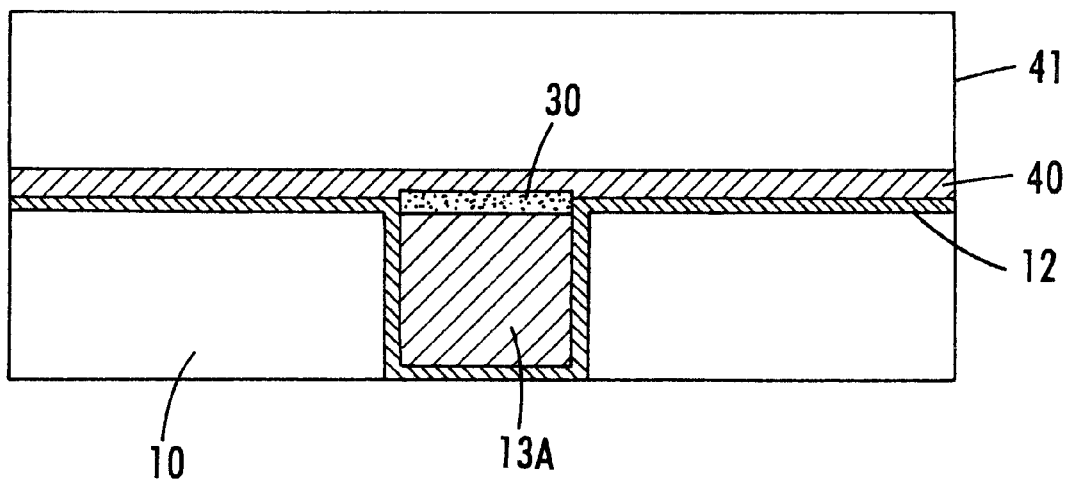

As shown in FIG. 4, subsequent to step (c), a plasma is generated and silicon nitride capping layer 40 is deposited on the cleaned exposed surface 30 of Cu interconnect 13A. Another interlayer dielectric 41 is then deposited, such as a low-k material. In this way, a plurality of interlayer dielectrics and metallization patterns are built up on a semiconductor substrate and various interconnects are formed.

Advantageously, the inventive methodology enables a reduction in the amount of time and power during which the unconstrained in-laid Cu is exposed, thereby significantly reducing hillock formation and, hence, electromigration failures. Moreover, the interface between the Cu interconnect and silicon nitride capping layer is substantially free of contamination and reaction products which would otherwise adversely affect adhesion therebetween, and adversely impact electromigration resistance, thereby improving the accuracy and reliability of interconnects for subsequent metallization levels and reducing electromigration failures.

The present invention enables the formation of extremely reliable capped Cu and/or Cu alloy interconnect members by significantly reducing hillock formation. In addition, the inventive methodology significantly reduces surface-contamination and reaction products at the interface between a plasma treated copper surface and silicon nitride capping layer deposited thereon, thereby enhancing the adhesion of the capping layer and reducing electromigration failures. Thus, the present invention significantly improves the reliability of Cu interconnect members by enhancing adhesion of the plasma capping layer with an attendant reduction in copper diffusion. In addition, the present invention enables a significant reduction in hillock formation and, hence, a significant increase in electromigration resistance. Consequently, the present invention advantageously reduces capping layer peeling, reduces copper diffusion, enhances electromigration resistance, improves device reliability, improves wafer-to-wafer uniformity, increases production throughput and reduces manufacturing costs.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising the sequential steps:
   (a) introducing a wafer containing inlaid copper (Cu) or a Cu alloy into a chamber;
   (b) treating an exposed surface of the Cu or Cu alloy with a plasma containing ammonia ($NH_3$) and nitrogen ($N_2$) in the chamber at a pressure;
   (c) introducing silane ($SiH_4$) into the chamber; and
   (d) depositing a silicon nitride capping layer on the surface of the Cu or Cu alloy in the chamber, wherein steps (c) and (d) are conducted under the pressure used in step (b), and step (c) is conducted by ramping up the introduction of $SiH_4$ into the chamber to a deposition flow rate in a plurality of flow rate stages.

2. The method according to claim 1, comprising conducting step (c) by ramping up the introduction of $SiH_4$ into the chamber to a deposition flow rate in two stages.

3. The method according to claim 2, wherein step (c) comprises the sequential stages:

($c_1$) introducing $SiH_4$ at a flow rate of about 70 to about 90 sccm; and
   ($c_2$) increasing the flow rate of silane to about 130 to about 170 sccm before initiating deposition of the silicon nitride capping layer.

4. The method according to claim 3, comprising conducting:
   stage ($c_1$) for about 2 to about 5 seconds; and
   stage ($c_2$) for about 3 to about 8 seconds.

5. The method according to claim 1, wherein:
   step (a) further comprises:
      generating a $N_2$ flow rate of about 8,000 to about 9,000 sccm;
      generating an $NH_3$ flow rate of about 210 to about 310 sccm;
      elevating the temperature to about 300° C.; and
      elevating the pressure to about 3 to about 5 Torr; and
   step (b) comprises treating the surface of the Cu or Cu alloy with the plasma containing $NH_3$ at an RF power of about 50 to about 200 watts and a temperature of about 300° C. to about 400° C.

6. The method according to claim 5, wherein step (c) comprises the sequential stages:
   ($c_1$) introducing $SiH_4$ at a flow rate of about 70 to about 90 sccm; and
   ($c_2$) increasing the flow rate of $SiH_4$ to about 130 to about 170 sccm before initiating deposition of the silicon nitride capping layer.

7. The method according to claim 6, comprising conducting:
   step (a) for about 10 to about 15 seconds;
   step (b) for about 5 to about 40 seconds;
   stage ($c_1$) for about 2 to about 3 seconds; and
   stage ($c_2$) for about 3 to about 8 seconds.

8. The method according to claim 6, comprising depositing the silicon nitride capping layer in step (d) at a RF power of about 400 to about 600 watts.

9. The method according to claim 8, comprising conducting step (d) for about 8 seconds to about 15 seconds.

10. The method according to claim 8, comprising depositing the silicon nitride capping layer at a thickness of about 450 Å to about 550 Å.

11. The method according to claim 1, wherein the inlaid Cu or Cu alloy comprises a dual damascene structure comprising a Cu or a Cu alloy line in contact with an underlying Cu or Cu alloy via formed in a dielectric layer.

12. The method according to claim 11, wherein the dielectric layer has a dielectric constant less than about 3.9.

13. A method of manufacturing a semiconductor device, the method comprising the following sequential steps:
   (a) introducing a wafer containing a copper (Cu) alloy interconnect into a deposition chamber, introducing nitrogen ($N_2$) at a flow rate of about 8,000 to about 9,20 sccm, introducing ammonia ($NH_3$) at a flow rate of about 210 to about 310 sccm, elevating a temperature and elevating a pressure;
   (b) generating a plasma at a RF power of about 50 to about 200 watts, pressure of about 3 to about 5 Torr and temperature of about 300° C. to about 400° C. and treating an exposed surface of the Cu or Cu alloy interconnect with a plasma containing $NH_3$ and $N_2$;
   (c) introducing silane ($SiH_4$) into the deposition chamber, while maintaining the pressure at about 3 to about 5 Torr, in the following sequential stages:

($c_1$) introducing ($SiH_4$) at a flow rate of about 70 to about 90 sccm; and ($c_2$) increasing the flow rate of $SiH_4$ to about 130 to about 170 sccm; and (f) generating a plasma at an RF power of about 400 to about 600 watts and depositing a layer of silicon nitride on the Cu or alloy surface in the deposition chamber while maintaining the pressure at about 3 to about 5 Torr.

14. The method according to claim 13, comprising conducting steps (c) and (d) while maintaining the $N_2$ flow rate at about 8,000 to about 9,200 sccm and while maintaining the $NH_3$ flow rate about 210 to about 310 sccm.

15. The method according to claim 14, comprising conducting step (a) for about 10 to about 15 seconds;

step (b) for about 5 to about 40 seconds;

stage ($c_1$) for about 2 to about 5 seconds;

stage ($c_2$) for about 3 to about 8 seconds; and step (d) for about 8 to about 15 seconds.

16. The method according to claim 13, comprising depositing the silicon nitride capping layer at a thickness of about 450 Å to about 550 Å.

17. The method according to claim 13, wherein the Cu or Cu interconnect comprises dual damascene structure comprising a Cu or Cu alloy line in contact with an underlying Cu or Cu alloy via formed in a dielectric layer.

18. The method according to claim 17, wherein the dielectric layer has a dielectric constant less than about 3.9.

* * * * *